US009748103B2

(12) United States Patent
Jenne et al.

(10) Patent No.: US 9,748,103 B2
(45) Date of Patent: Aug. 29, 2017

(54) SONOS STACK WITH SPLIT NITRIDE MEMORY LAYER

(71) Applicant: Cypress Semiconductor Corporation, San Jose, CA (US)

(72) Inventors: Fredrick B. Jenne, Mountain House, CA (US); Krishnaswamy Ramkumar, San Jose, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/824,007

(22) Filed: Aug. 11, 2015

(65) Prior Publication Data

US 2016/0141180 A1    May 19, 2016

Related U.S. Application Data

(63) Continuation of application No. 14/265,129, filed on Apr. 29, 2014, now Pat. No. 9,105,512, which is a continuation of application No. 13/551,237, filed on Jul. 17, 2012, now Pat. No. 8,710,579, which is a
(Continued)

(51) Int. Cl.
| | |
|---|---|
| *H01L 21/31* | (2006.01) |
| *H01L 21/28* | (2006.01) |
| *G11C 16/04* | (2006.01) |
| *H01L 29/51* | (2006.01) |
| *H01L 29/792* | (2006.01) |
| *H01L 27/11563* | (2017.01) |
| *H01L 21/02* | (2006.01) |
| *H01L 29/423* | (2006.01) |

(52) U.S. Cl.
CPC ........ *H01L 21/28282* (2013.01); *G11C 16/04* (2013.01); *H01L 21/022* (2013.01); *H01L 21/02323* (2013.01); *H01L 27/11563* (2013.01); *H01L 29/4234* (2013.01); *H01L 29/513* (2013.01); *H01L 29/792* (2013.01)

(58) Field of Classification Search
None
See application file for complete search history.

(56) References Cited

U.S. PATENT DOCUMENTS

| | | | |
|---|---|---|---|
| 5,817,170 A | 10/1998 | Desu et al. | |
| 5,834,351 A * | 11/1998 | Chang | H01L 27/11534 257/E21.684 |
| 6,153,543 A | 11/2000 | Chesire et al. | |

(Continued)

FOREIGN PATENT DOCUMENTS

| | | |
|---|---|---|
| CN | 101364602 B | 9/2010 |
| CN | 101558481 B | 5/2012 |
| WO | 2011162725 A1 | 12/2011 |

OTHER PUBLICATIONS

EPO Search Report for European Application No. 13767277.0 dated Sep. 18, 2015; 7 pages.

(Continued)

*Primary Examiner* — Reema Patel

(57) ABSTRACT

A semiconductor device includes a polysilicon substrate, a first oxide layer formed on the polysilicon substrate, an oxygen-rich nitride layer formed on the first oxide layer, a second oxide layer formed on the oxygen-rich nitride layer, and an oxygen-poor nitride layer formed on the second oxide layer.

5 Claims, 15 Drawing Sheets

Related U.S. Application Data continuation of application No. 12/767,105, filed on Apr. 26, 2010, now Pat. No. 8,222,688.

(60) Provisional application No. 61/172,320, filed on Apr. 24, 2009.

(56) References Cited

U.S. PATENT DOCUMENTS

| | | | |
|---|---|---|---|
| 6,214,689 B1 | 4/2001 | Lim et al. | |
| 6,429,081 B1 | 8/2002 | Doong et al. | |
| 6,461,899 B1 | 10/2002 | Kitakado et al. | |
| 6,818,558 B1 | 11/2004 | Rathor et al. | |
| 6,833,582 B2 | 12/2004 | Mine et al. | |
| 6,946,349 B1 | 9/2005 | Lee et al. | |
| 7,060,594 B2 | 6/2006 | Wang | |
| 7,112,486 B2 | 9/2006 | Cho et al. | |
| 7,279,740 B2 | 10/2007 | Bhattacharyya et al. | |
| 7,315,474 B2 | 1/2008 | Lue | |
| 7,576,386 B2 | 8/2009 | Lue et al. | |
| 7,636,257 B2 | 12/2009 | Lue | |
| 7,646,637 B2 | 1/2010 | Liao | |
| 7,723,789 B2 | 5/2010 | Lin et al. | |
| 7,999,295 B2 | 8/2011 | Lai et al. | |
| 8,222,688 B1 | 7/2012 | Jenne et al. | |
| 8,283,261 B2 | 10/2012 | Ramkumar | |
| 8,318,608 B2 | 11/2012 | Ramkumar et al. | |
| 8,710,578 B2 | 4/2014 | Jenne et al. | |
| 2001/0036751 A1* | 11/2001 | Park | H01L 21/02238 438/773 |
| 2001/0052615 A1 | 12/2001 | Fujiwara | |
| 2003/0122204 A1 | 7/2003 | Nomoto et al. | |
| 2004/0108540 A1* | 6/2004 | Yoshino | H01L 27/11568 257/315 |
| 2004/0173918 A1 | 9/2004 | Kamal et al. | |
| 2004/0207002 A1 | 10/2004 | Ryu et al. | |
| 2005/0006696 A1* | 1/2005 | Noguchi | H01L 27/115 257/316 |
| 2005/0026637 A1 | 2/2005 | Fischer et al. | |
| 2005/0070126 A1 | 3/2005 | Senzaki | |
| 2005/0093054 A1 | 5/2005 | Jung | |
| 2005/0098839 A1 | 5/2005 | Lee et al. | |
| 2005/0215074 A1* | 9/2005 | Shone | H01L 21/28282 438/786 |
| 2005/0266637 A1 | 12/2005 | Wang | |
| 2006/0081331 A1 | 4/2006 | Campian | |
| 2006/0111805 A1 | 5/2006 | Yokoyama et al. | |
| 2006/0113586 A1 | 6/2006 | Wang | |
| 2006/0220106 A1 | 10/2006 | Choi et al. | |
| 2006/0281331 A1 | 12/2006 | Wang | |
| 2007/0029625 A1 | 2/2007 | Lue et al. | |
| 2007/0031999 A1 | 2/2007 | Ho et al. | |
| 2007/0051306 A1 | 3/2007 | Ivanov et al. | |
| 2007/0066087 A1 | 3/2007 | Jung | |
| 2007/0134876 A1 | 6/2007 | Lai et al. | |
| 2007/0272968 A1* | 11/2007 | Masukawa | H01L 27/11521 257/315 |
| 2008/0029399 A1 | 2/2008 | Tomita et al. | |
| 2008/0067577 A1 | 3/2008 | Wang et al. | |
| 2008/0087942 A1 | 4/2008 | Hsu et al. | |
| 2008/0150003 A1 | 6/2008 | Chen et al. | |
| 2008/0272424 A1 | 11/2008 | Kim et al. | |
| 2008/0286927 A1 | 11/2008 | Kim et al. | |
| 2009/0011609 A1 | 1/2009 | Ramkumar et al. | |
| 2009/0039414 A1 | 2/2009 | Lue et al. | |
| 2009/0065852 A1 | 3/2009 | Lin et al. | |
| 2009/0096017 A1 | 4/2009 | Lai et al. | |
| 2009/0179253 A1 | 7/2009 | Levy et al. | |
| 2009/0227116 A1 | 9/2009 | Joo et al. | |
| 2010/0283097 A1 | 11/2010 | Endoh et al. | |
| 2011/0248332 A1 | 10/2011 | Levy et al. | |
| 2012/0068250 A1 | 3/2012 | Ino et al. | |

OTHER PUBLICATIONS

International Search Report for International Application No. PCT/US13/29784 dated May 20, 2013; 2 pages.

Suhane et al., "Experimental Evaluation of Trapping Efficiency in Silicon Nitride Based Charge Trapping Memories", Solid State Device Research Conference, 2009, 4 pages.

Taiwanese Office Action for Taiwan Application No. 102110016 dated Oct. 6, 2016; 8 pages.

U.S. Final Rejection for U.S. Appl. No. 13/551,237 dated Oct. 11, 2013; 9 pages.

U.S. Final Rejection for U.S. Appl. No. 14/265,129 dated Feb. 10, 2015; 6 pages.

U.S. Non Final Rejection for U.S. Appl. No. 12/767,105 dated Apr. 21, 2011; 7 pages.

U.S. Non Final Rejection for U.S. Appl. No. 12/767,105 dated Oct. 18, 2011; 7 pages.

U.S. Non Final Rejection for U.S. Appl. No. 13/431,069 dated Aug. 16, 2013; 7 pages.

U.S. Non Final Rejection for U.S. Appl. No. 13/551,237 dated Jul. 18, 2013; 6 pages.

U.S. Non-Final Rejection for U.S. Appl. No. 14/265,129 dated Oct. 24, 2014; 11 pages.

U.S. Notice of Allowance for U.S. Appl. No. 12/767,105 dated Apr. 4, 2012; 8 pages.

U.S. Notice of Allowance for U.S. Appl. No. 13/431,069 dated Nov. 8, 2013; 9 pages.

U.S. Notice of Allowance for U.S. Appl. No. 13/551,237 dated Oct. 29, 2013; 9 pages.

U.S. Notice of Allowance for U.S. Appl. No. 14/265,129 dated Mar. 13, 2015; 8 pages.

Witten Opinion of the International Searching Authority for International Application No. PCT/USI3/29784 dated May 20, 2013; 6 pages.

Japanese Office Action for International Application No. 2015-503236 dated Jan. 17, 2017; 8 pages.

SIPO Office Action for International Application No. 2013800168824 dated Apr. 19, 2017; 9 pages.

TIPO Office Action for Taiwanese Application No. 106107952 dated Jun. 6, 2017; 7 pages.

* cited by examiner

SONOS STACK WITH SPLIT NITRIDE MEMORY LAYER

PRIORITY CLAIM

This application is a continuation of U.S. patent application Ser. No. 14/265,129, now U.S. Pat. No. 9,105,512 issued Aug. 11, 2015, which is a continuation of U.S. patent application Ser. No. 13/551,237 filed Jul. 17, 2012, now U.S. Pat. No. 8,710,579, issued Apr. 29, 2014, which is a continuation of U.S. patent application Ser. No. 12/767,105, filed Apr. 26, 2010, now U.S. Pat. No. 8,222,688, issued Jul. 17, 2012, which claims priority under 35 U.S.C. 119 to U.S. provisional application No. 61/172,320, filed on Apr. 24, 2009, which is incorporated herein by reference in its entirety.

BACKGROUND

Non-volatile semiconductor memories, such as a split gate flash memory, sometimes use a stacked floating gate structure, in which electrons are induced into a floating gate of a memory cell to be programmed by biasing a control gate and grounding a body region of a substrate on which the memory cell is formed.

An oxide-nitride-oxide (ONO) stack may be used as either a charge storing layer, as in silicon-oxide-nitride-oxide-silicon (SONOS) transistor, or as an isolation layer between the floating gate and control gate, as in a split gate flash memory.

FIG. 1 is a partial cross-sectional view of a structure for a semiconductor device 100 having a SONOS gate stack or structure 102. The structure 100 includes a conventional ONO stack 104 formed over a surface 106 of a silicon substrate 108. The device 100 typically further includes one or more diffusion regions 110, such as source and drain regions, aligned to the gate stack and separated by a channel region 112. The SONOS structure 102 includes a polysilicon gate layer 114 formed upon and in contact with the ONO stack 104. The poly gate 114 is separated or electrically isolated from the substrate 108 by the ONO stack 104. The ONO stack 104 generally includes a lower (tunnel) oxide layer 116, a nitride or oxynitride layer 118 which serves as a charge storing or memory layer for the device 100, and a topoxide layer 120 overlying the nitride or oxynitride layer.

One problem with this conventional SONOS structure 102 is the poor data retention of the nitride or oxynitride layer 118 that limits the device 100 lifetime and/or its use in several applications due to leakage current through the layer. Another problem with conventional SONOS structures 102 is that the stochiometry of the layer 118 is nonuniform across the thickness of the layer. In particular, the layer 118 is conventionally formed or deposited in a single step using a single process gas mixture and fixed or constant processing conditions in an attempt to provide a homogeneous layer having a high nitrogen and high oxygen concentration across the thickness of the relatively thick layer. However, this may result in nitrogen, oxygen and silicon concentrations that vary throughout the conventional layer 118. Consequently, the charge storage characteristics, and in particular programming and erase speed and data retention of a memory device 100 made with the ONO stack 104, are adversely effected.

FIG. 2-5 illustrate charge retention and migration in a conventional SONOS structure such as the one illustrated in FIG. 1. Charge traps are distributed through the nitride layer 118. The distribution of traps is uniform under ideal stochiometric conditions (FIG. 2), but typically the distribution would not be so ideally uniform. When an ERASE (FIG. 3) is performed, holes migrate toward the blocking oxide 120. Electron charge accumulates at the layer boundaries after programming (FIG. 4). This stored charge distribution can lead to significant leakage due to tunneling at the nitride boundaries, for example by the process illustrated in the energy diagram FIG. 5, in which stored charge transitions among trapped states (e.g. $E_{T4}$, $E_{TD}$) to cause leakage.

Thus there is an ongoing need for a memory device that exhibits improved data retention and improved stochiometry.

DETAILED DESCRIPTION

Figure 1:
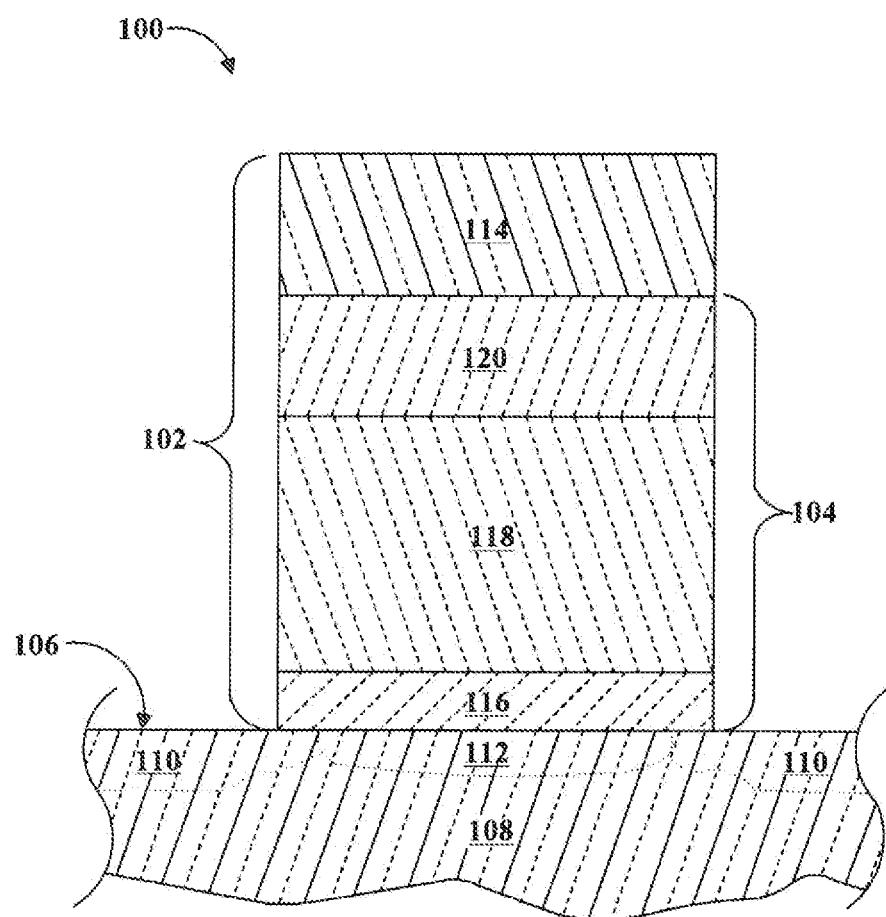
FIG. 1 is a cross-sectional view of a conventional SONOS structure.
Figure 2:
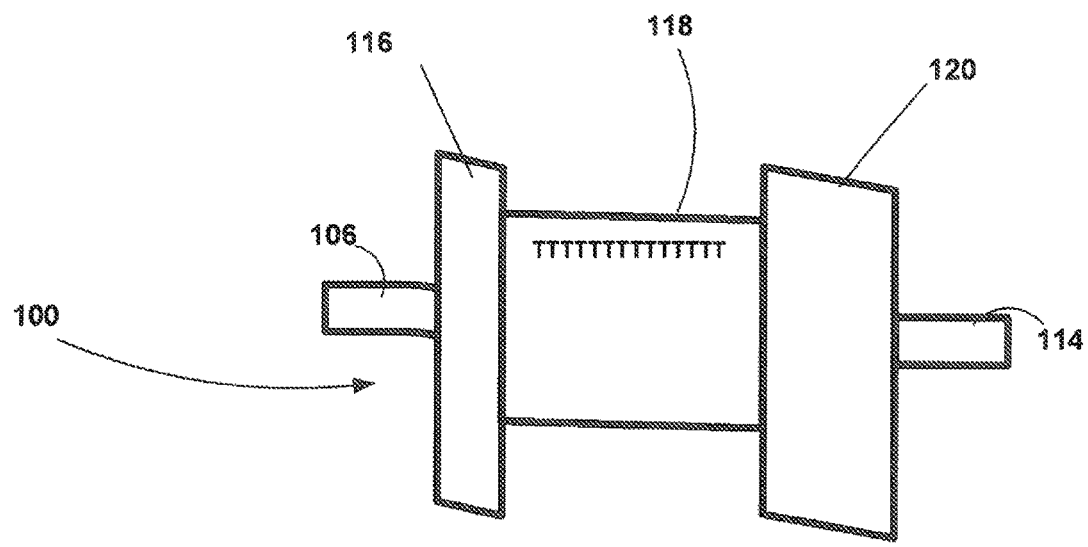
FIG. 2-4 illustrate charge retention and migration in a conventional SONOS structure such as the one illustrated in FIG. 1.
Figure 2:
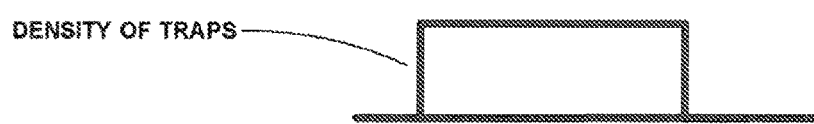
Figure 3:
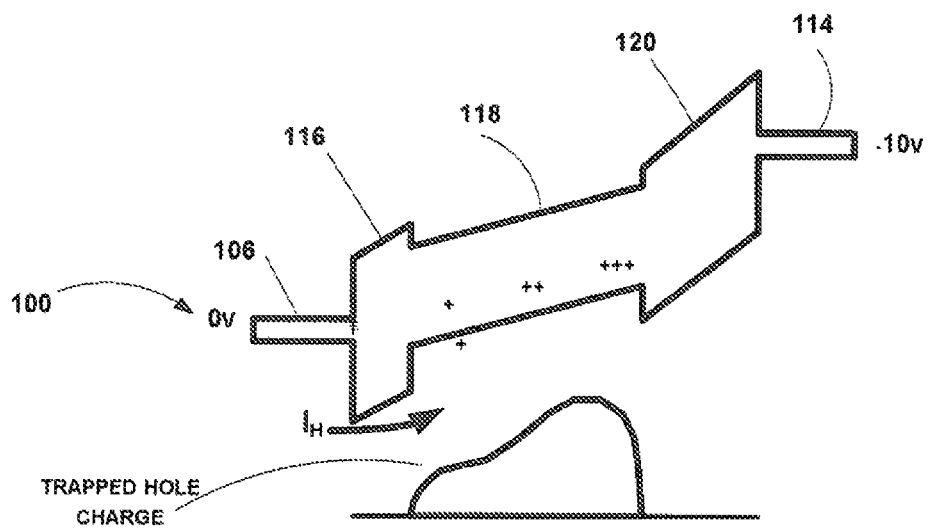
Figure 4:
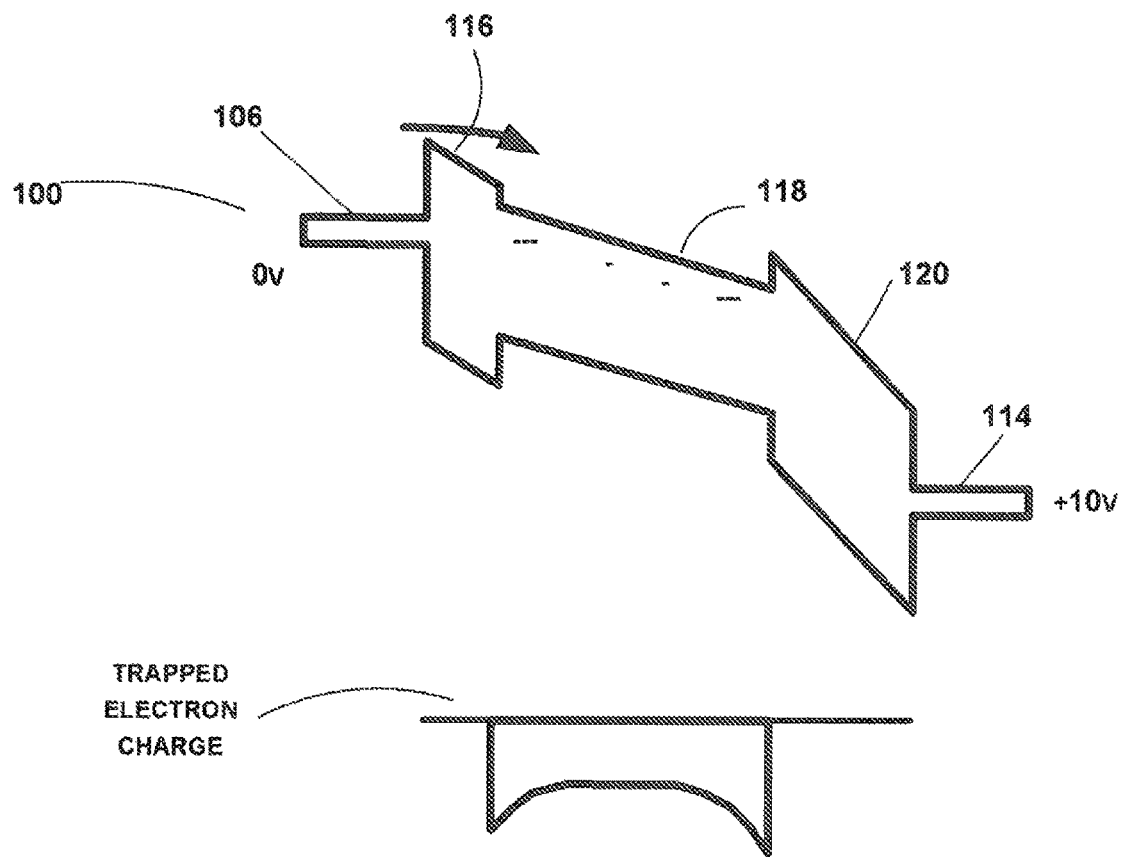
Figure 5:
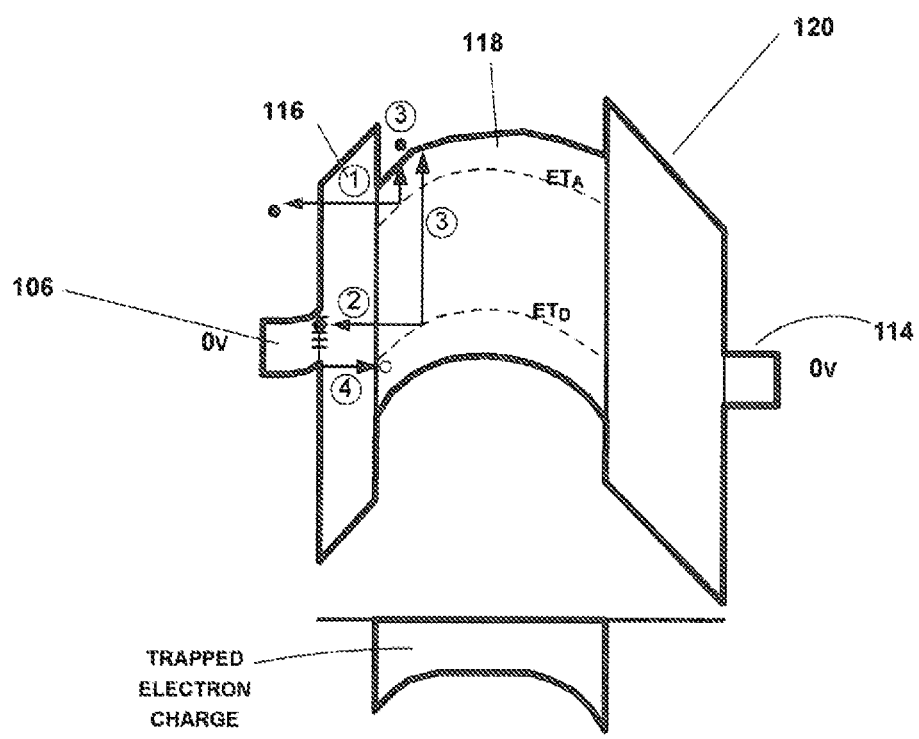
FIG. 5—illustrates an energy band diagram for a conventional SONOS structure, in which stored charge transitions among trapped states (e.g. $E_{T4}$, $E_{TD}$) to cause leakage.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

Overview

A charge-storage circuit may be formed with multiple charge storing layers including multiple nitride layers having differing concentrations of oxygen, nitrogen and/or silicon. The nitride layers may include at least a top nitride layer and a bottom nitride layer. At least the bottom nitride layer may comprise silicon oxynitride (e.g. $Si_xO_yN_x$). The stoichiometric compositions of the layers may be tailored or selected such that the lower or bottom nitride has a high oxygen and silicon content, and the top nitride layer has high silicon and a high nitrogen concentration with a low oxygen concentration to produce a silicon-rich nitride or oxynitride. The silicon-rich and oxygen-rich bottom nitride layer reduces stored charge loss without compromising device speed or an initial (beginning of life) difference between program and erase voltages. The silicon-rich, oxygen-lean top nitride layer increases a difference between programming and erase voltages when the structure is employed in memory devices, thereby improving device speed, increasing data retention, and extending the operating life of the device.

However, this structure also has drawbacks in terms of charge retention. Therefore, a middle oxide layer may be formed between the two nitride layers, forming a split charge-trapping region comprising two nitride layers separated by a relatively thin oxide layer. In one embodiment, the two nitride layers are approximately equal thicknesses. Each nitride layer may be at least 30 Å. The middle oxide layer may be at least 5 Å. Some tolerance for process variations is also envisioned, for example +−2 Å. In general, the middle oxide layer will be thin relative to the two nitride layers, where 'thin relative to' means at least a ratio of about 0.75:1. One nitride layer (the bottom layer) may be closer to a substrate, and oxygen-rich relative to the other (upper) nitride layer.

One process for manufacturing such a semiconductor device includes forming a first oxide layer on a silicon substrate; forming a first nitride layer on the first oxide layer; applying radical oxidation to the first nitride layer to form a second oxide layer; and forming a second nitride layer on the second oxide layer. The first nitride layer is made oxygen-rich relative to the second nitride layer by varying the process parameters. For example, each nitride layer may be formed using a low pressure CVD process using a silicon source, a nitrogen source, and an oxygen-containing gas. With appropriate process parameters, a bottom oxynitride layer may be formed that is a silicon-rich and oxygen-rich, and a top nitride layer is may be formed that is silicon-rich, nitrogen-rich, and oxygen-lean. In one embodiment the first (lower) nitride layer is formed to a thickness of between 35 Å and 80 Å, oxidized to a depth of between 5 Å and 20 Å to form the middle oxide layer, and then the second nitride layer is formed over the middle oxide layer to a thickness of between 30 Å and 60 Å. The first (tunnel) oxide layer on the silicon substrate may be formed to a thickness of about 15-20 Å. Again, some tolerance for process variations are envisioned, for example +−2 Å.

A third oxide layer may be formed over the second nitride layer, to a thickness of about 40-50 Å, and a polysilicon or metal gate layer may be formed over the third oxide layer.

Multi-Layer Charge Storing Structure

Figure 6:
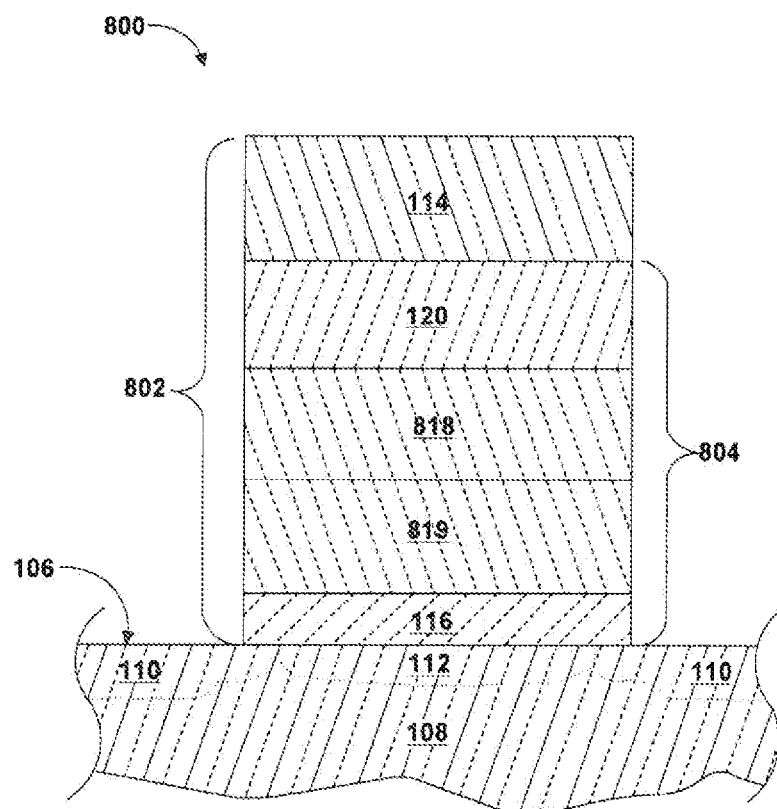
FIG. 6 is a cross-sectional view of a SONNOS structure.

FIG. 6 is a block diagram illustrating a cross-sectional side view of a portion of a semiconductor memory device 800. The memory device 800 includes a SONNOS gate stack 802 including an ONNO structure 804 formed over a surface 106 of silicon layer on a substrate 108. The device 800 further includes one or more diffusion regions 110, such as source and drain regions, aligned to the gate stack 802 and separated by a channel region 112. Generally, the SONNOS structure 802 includes a gate layer 114 formed upon and in contact with the ONNO structure 804. The gate 114 is isolated from the substrate 108 by the ONNO structure 804. The ONNO structure 804 includes a thin, lower oxide layer or tunneling oxide layer 116 that isolates the gate stack 802 from the channel region 112, a top or blocking oxide layer 120, and a multi-layer charge storing layer 804 including multiple nitride containing layers. Preferably, the multi-layer charge storing layer 804 includes at least two nitride layers, including a top nitride layer 818 and a bottom nitride layer 819.

Figure 7:
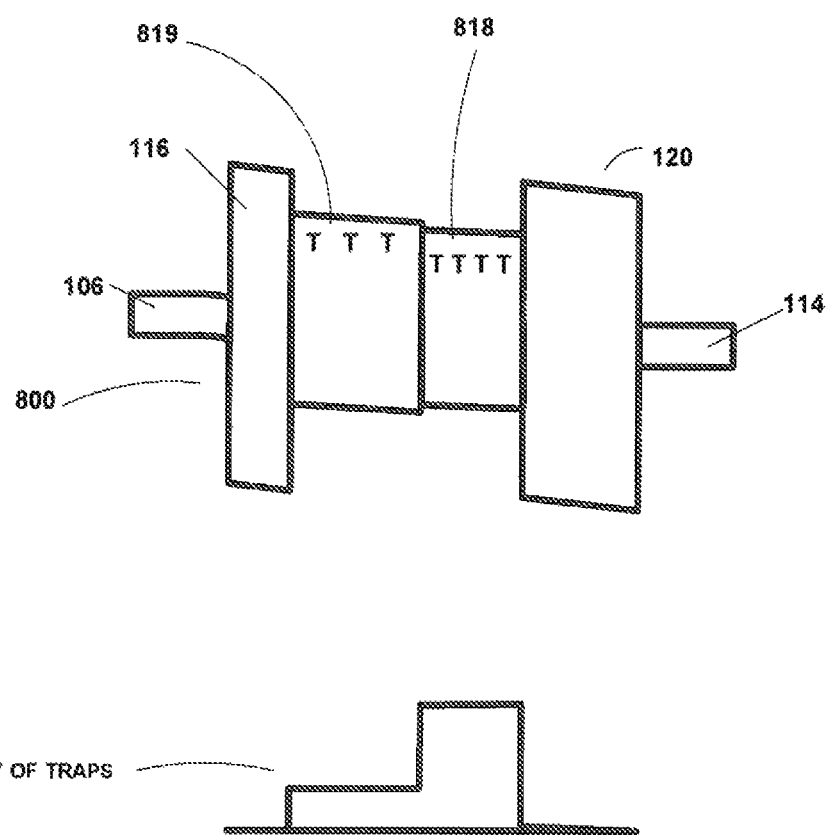
FIG. 7-9 illustrate charge retention and migration in a SONNOS structure such as the one illustrated in FIG. 6.
Figure 8:
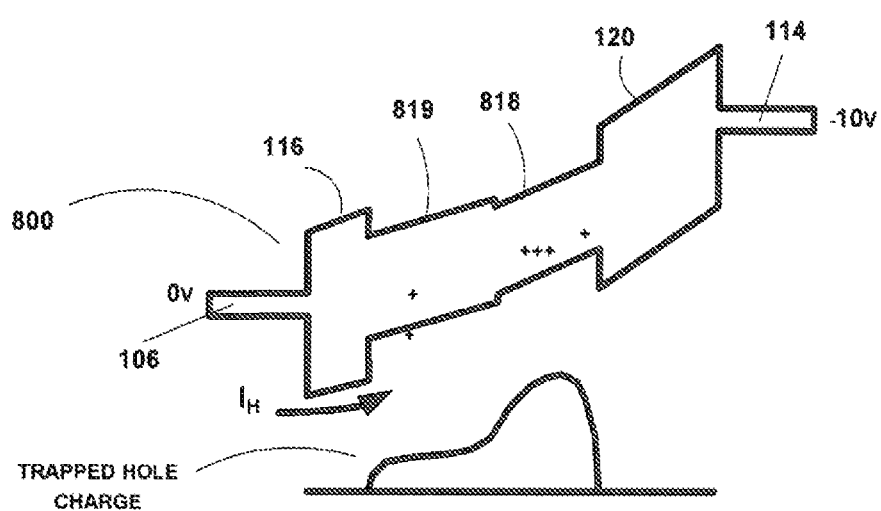
Figure 9:
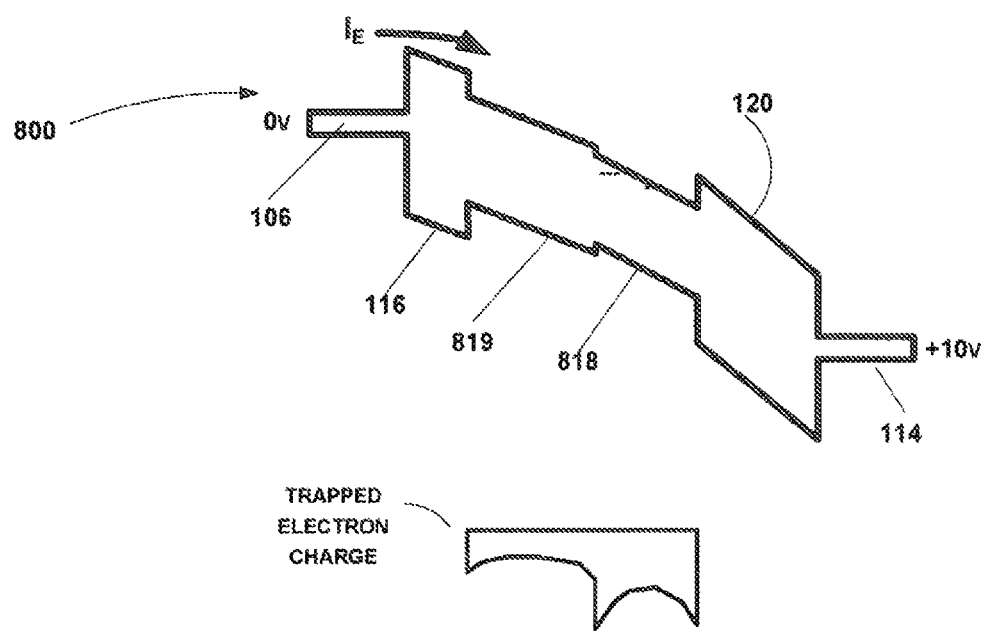
Figure 10:
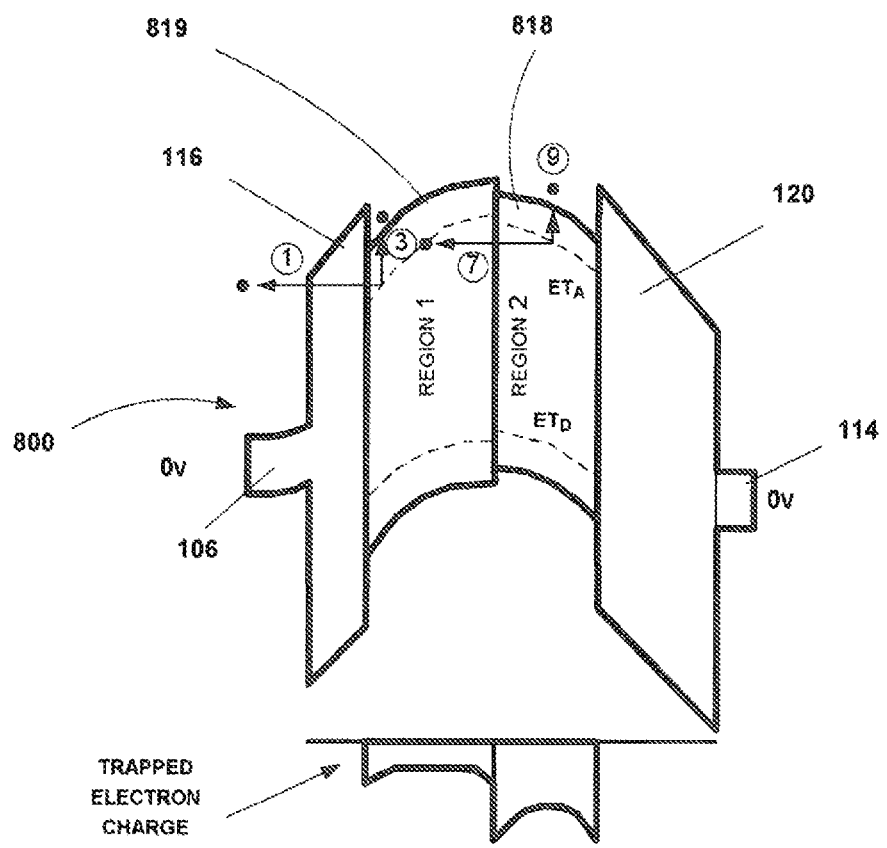
FIG. 10 illustrates an energy band diagram for a SONNOS structure in which stored charge transitions among trapped states (e.g. $E_{T4}$, $E_{TD}$) to cause leakage.

FIG. 7-9 illustrate charge retention and migration in a SONNOS structure such as the one illustrated in FIG. 6. Charge traps are distributed through the nitride layers 818, 819, with a distribution that is uniform under ideal stochiometric conditions (FIG. 7). As a result of an ERASE (FIG. 8), holes migrate toward the blocking oxide 120. Electron charge accumulates at the boundaries of the upper nitride layer 818 after programming (FIG. 9), and there is less accumulation of charge at the lower boundary of the lower nitride layer 819. This may result in lower leakage current. Nonetheless, this charge distribution may lead to charge leakage due to tunneling at the nitride boundaries, as shown for example in FIG. 10, which illustrates how charge may transition among different trapped states (e.g. $E_{TA}$, $E_{TD}$) to cause leakage after programming.

Oxide Split Multi-Layer Charge Storing Structure

Figure 11:
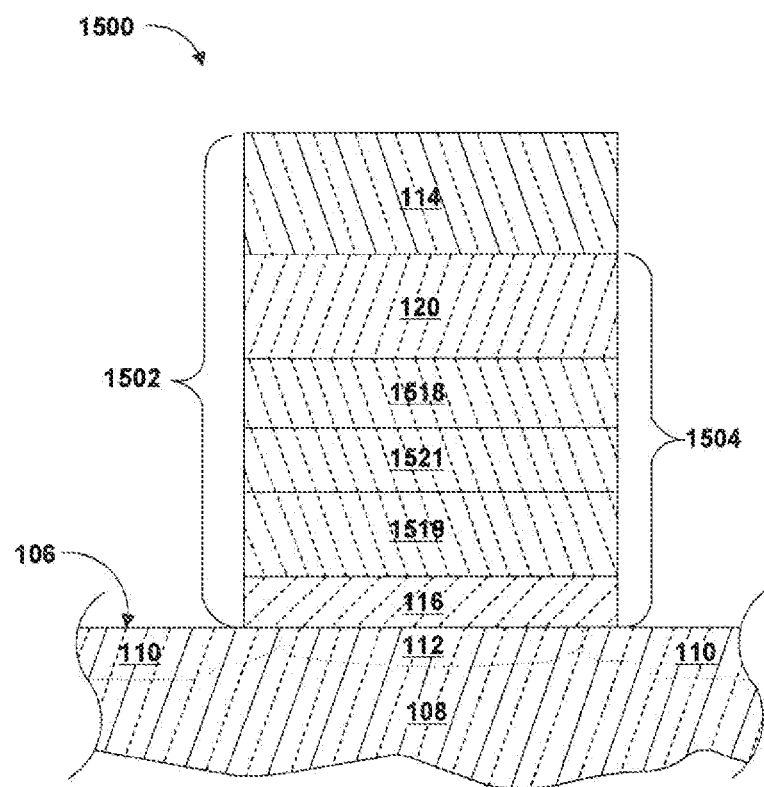
FIG. 11 is a cross-sectional view of a SONONOS structure.

FIG. 11 is a block diagram illustrating a cross-sectional side view of a semiconductor memory device 1500. The memory device 1500 includes a SONONOS stack 1502 including an ONONO structure 1504 formed over a surface 106 of a substrate 108. Substrate 108 includes one or more diffusion regions 110, such as source and drain regions, aligned to the gate stack 1502 and separated by a channel region 112. Generally, the SONONOS structure 1502 includes a polysilicon or metal gate layer 114 formed upon and in contact with the ONONO structure 1504. The gate 114 is separated or electrically isolated from the substrate 108 by the ONONO structure 1504. The ONONO structure 1504 includes a thin, lower oxide layer or tunneling oxide layer 116 that separates or electrically isolates the stack 1502 from the channel region 112, a top or blocking oxide layer 120, and a multi-layer charge storing layer 1504 including multiple nitride containing layers 1518, 1519. Preferably, the multi-layer charge storing layer 1504 includes at least two nitride layers, including a top nitride layer 1518, a bottom oxynitride layer 1519, and an intermediate oxide layer 1521.

The various layers of the device 1500 may be fabricated to certain thicknesses. Different possibilities for the thicknesses are described herein, representing possible different embodiments. In general, the middle oxide layer will be relatively thin in comparison to the two nitride layers. For example, the middle oxide may be between approximately 5 Å and 20 Å. The nitride layers may be the same or different thicknesses as one another, but will typically be at least approximately 30 Å. With advances in process technology and material science, nitride thicknesses as low as 20 Å may be possible in the near future.

Figure 12:
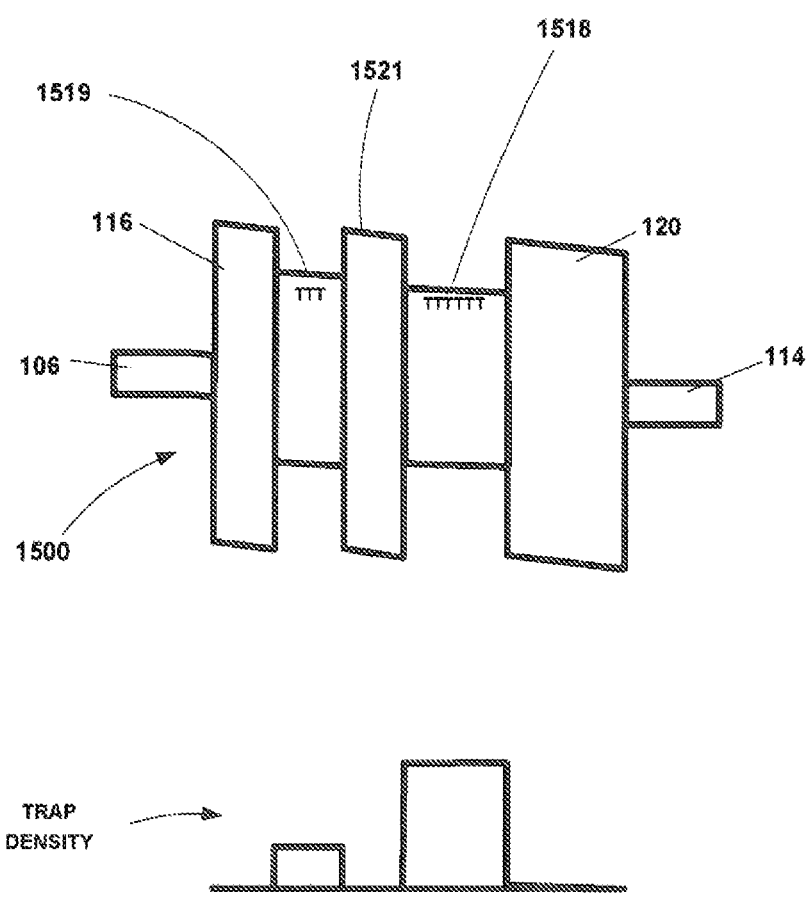
FIG. 12-14 illustrate charge retention and migration in a SONONOS structure such as the one illustrated in FIG. 14.
Figure 13:
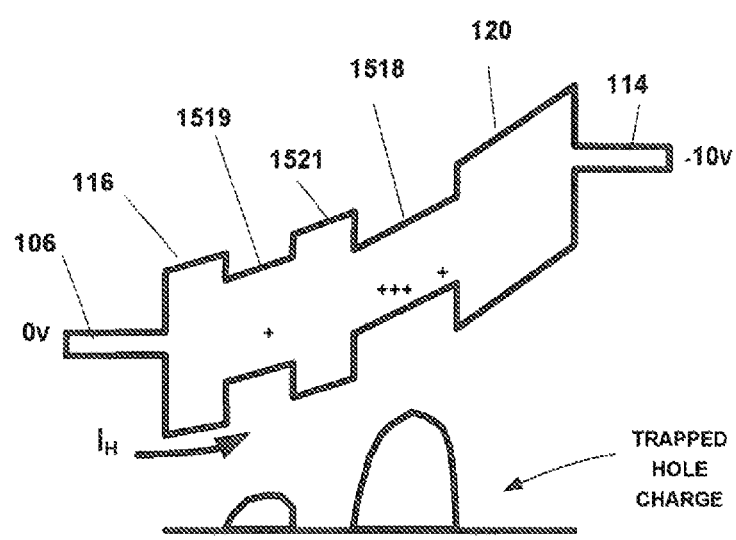
Figure 14:
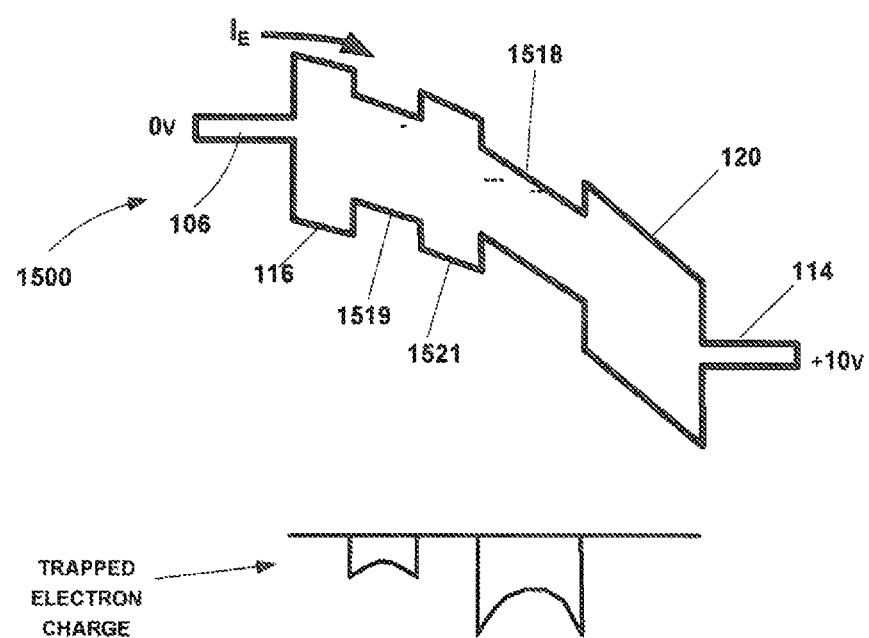
Figure 15:
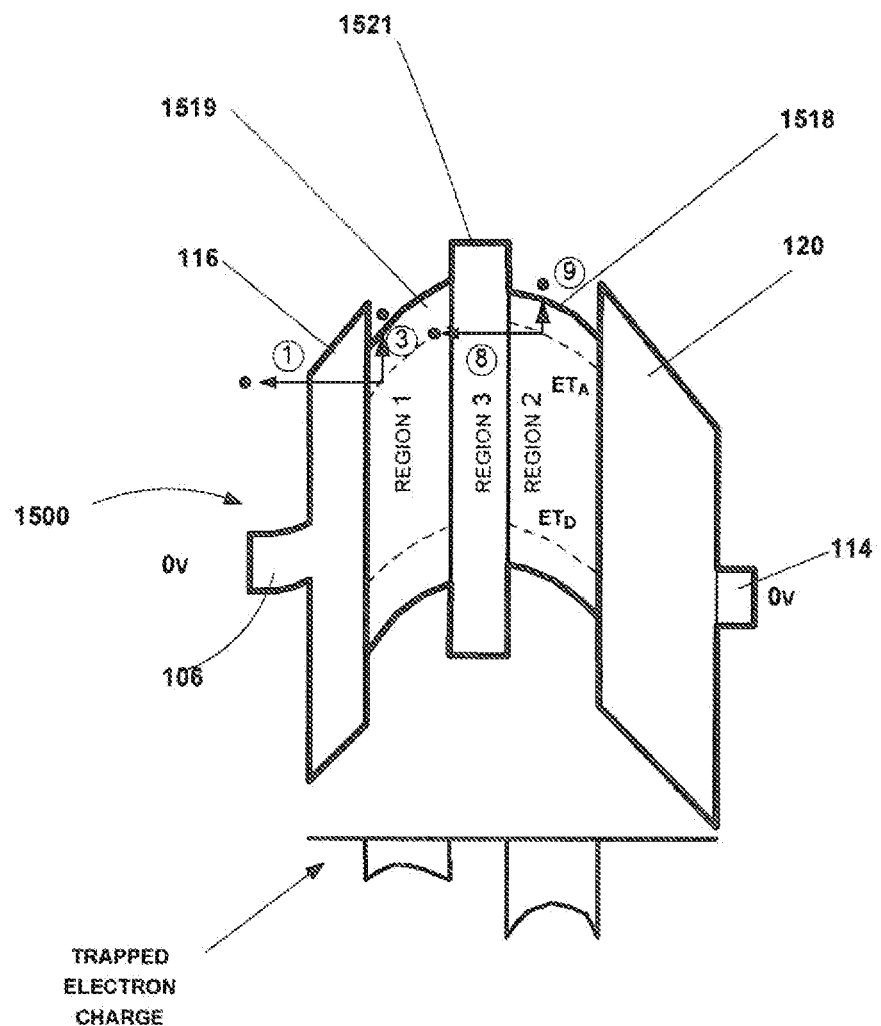
FIG. 15 illustrates an energy band diagram for a SONONOS structure in which stored charge transitions among trapped states (e.g. $E_{T4}$, $E_{TD}$) to cause leakage.

FIG. 12-14 illustrate charge retention and migration in a SONONOS structure such as the one illustrated in FIG. 11. Charge traps are distributed in the two nitride layers 1518, 1519, with a discontinuity where the intermediate oxide layer 1521 resides (few or no traps form in the oxide layer 1521). The majority of traps form in the top nitride layer 1518. Within each nitride layer, trap distribution is more or less uniform under ideal stochiometric conditions (FIG. 12). As a result of an ERASE (FIG. 13), holes migrate toward the blocking oxide 120, but the majority of trapped hole charges form in the top nitride layer 1518. Electron charge accumulates at the boundaries of the upper nitride layer 1518 after programming (FIG. 14), and there is less accumulation of charge at the lower boundary of the lower nitride layer 1519. Furthermore, due to the intermediate oxide 1521, the probability of tunneling by trapped electron charges in the upper nitride layer 1518 is substantially reduced. This may result in lower leakage current than for the structures illustrated in FIG. 1 and FIG. 6. This charge distribution significantly lowers the probability of tunneling from the upper nitride layer, as shown for example in the energy band diagrams FIG. 15, which illustrate the obstacles to tunneling that charges encounter as they transition among different trapped states (e.g. $E_{TA}$, $E_{TD}$) after programming.

Fabrication Techniques

A process of forming a SONOS structure with superior charge retention begins with forming a first oxide layer, such as a tunneling oxide layer, of the ONO structure over a substrate. The substrate may be, for example, polysilicon, or a silicon surfaced germanium substrate. Next, the first nitride layer of a multi-layer charge storing structure is formed on the first oxide layer. This first or bottom nitride layer may be formed, for example, by a CVD process including N2O/NH3 and DCS/NH3 gas mixtures in ratios and at flow rates tailored to provide a silicon-rich and oxygen-rich oxynitride layer. The first nitride layer is then oxidized to a chosen depth using radical oxidation. This forms the middle oxide layer. Radical oxidation may be performed, for example, at a temperature of 1000-1100 C using a single wafer tool, or 800-900 C using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

The second nitride layer of the multi-layer charge storing structure is then formed on the middle oxide layer. The second nitride layer has a stoichiometric composition of oxygen, nitrogen and/or silicon different from that of the first (lower) nitride layer. The second nitride layer may be formed or deposited by a CVD process using a process gas including DCS/NH3 and N2O/NH3 gas mixtures in ratios and at flow rates tailored to provide a silicon-rich, oxygen-lean top nitride layer. Finally, a second oxide layer of the ONO structure is formed on a surface of the second nitrided layer. This top or blocking oxide layer may be formed or deposited by any suitable means. In one embodiment the top oxide is a high temperature oxide deposited in a HTO CVD process. Alternatively, the top or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the top nitride layer to a chosen depth using radical oxidation.

In some embodiments, it may be possible perform fabrication by forming the tunnel oxide layer in one chamber of a CVD tool, then form the bottom oxynitride layer in a second chamber of the CVD tool, then radical oxidize the lower oxynitride layer in the first chamber, then deposit more nitride in the second chamber, then radical oxidize the second nitride layer in the first chamber again, thus forming the semiconductor device using a two-chamber process.

Fabrication may further involve forming or depositing a silicon containing layer on a surface of the second oxide layer to complete a SONOS stack. The silicon containing layer may, for example, be a polysilicon layer deposited by a CVD process to form a control gate of a SONOS transistor or device. In some embodiments metal may be deposited instead of polysilicon.

Generally, the substrate 108 may include any known silicon-based semiconductor material including silicon, silicon-germanium, silicon-on-insulator, or silicon-on-sapphire substrate. Alternatively, the substrate 108 may include a silicon layer formed on a non-silicon-based semiconductor material, such as gallium-arsenide, germanium, gallium-nitride, or aluminum-phosphide. Preferably, the substrate 108 is a doped or undoped silicon substrate.

The lower oxide layer or tunneling oxide layer 116 generally includes a relatively thin layer of silicon dioxide (SiO2) of from about 15 Å to about 22 Å, and more preferably about 18-20 Å, with some process variation (e.g. +−1 Å). The tunneling oxide layer 116 may be formed or deposited by any suitable means including, for example, being thermally grown or deposited using chemical vapor deposition (CVD). In one embodiment, the tunnel oxide layer is formed or grown using a steam anneal. This involves a wet-oxidizing process in which the substrate 108 is placed in a in a deposition or processing chamber, heated to a temperature from about 700° C. to about 850° C., and exposed to a wet vapor for a predetermined period of time selected based on a desired thickness of the finished tunneling oxide layer 116. Exemplary process times are from about 5 to about 20 minutes. The oxidation may be performed at atmospheric or at low pressure, or using a dry process under ambient conditions using either batch or single wafer tools.

The multi-layer charge storing structure generally includes at least two nitride layers having differing compositions of silicon, oxygen and nitrogen, and a middle oxide layer between the two nitride layers. In a preferred embodiment the nitride layers are formed or deposited in a low pressure CVD process using a silicon source, such as silane (SiH4), chlorosilane (SiH3Cl), dichlorosilane (SiH2Cl2), tetrachlorosilane (SiCl4) or Bis-TertiaryButylAmino Silane (BTBAS), a nitrogen source, such as nitrogen (N2), ammonia (NH3), nitrogen trioxide (NO3) or nitrous oxide (N2O), and an oxygen-containing gas, such as oxygen (O2) or N2O. Alternatively, gases in which hydrogen has been replaced by deuterium can be used, including, for example, the substitution of deuterated-ammonia (ND3) for NH3. The substitution of deuterium for hydrogen advantageously passivates Si dangling bonds at the silicon-oxide interface, thereby increasing the endurance of the devices.

For example, the lower or bottom oxynitride layer 819, 1519 may be deposited over the tunneling oxide layer 116 by placing the substrate 108 in a deposition chamber and introducing a process gas including N2O, NH3 and DCS, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. The process gas may include a first gas mixture of N2O and NH3 mixed in a ratio of from about 8:1 to about 1:8 and a second gas mixture of DCS and NH3 mixed in a ratio of from about 1:7 to about 7:1, and may be introduced at a flow rate of from about 5 to about 200 standard cubic centimeters per minute (sccm). A layer produced or deposited under these condition yields a silicon-rich, oxygen-rich, bottom oxynitride layer 819, that decrease the charge loss rate after programming and after erase, which may be manifested in a small voltage shift in the retention mode.

The top nitride layer 818, 1518 may be deposited in a CVD process using a process gas including N2O, NH3 and DCS, at a chamber pressure of from about 5 mT to about 500 mT, and at a substrate temperature of from about 700° C. to about 850° C. and more preferably at least about 780° C., for a period of from about 2.5 minutes to about 20 minutes. The process gas may include a first gas mixture of N2O and NH3 mixed in a ratio of from about 8:1 to about 1:8 and a second gas mixture of DCS and NH3 mixed in a ratio of from about 1:7 to about 7:1, and may be introduced at a flow rate of from about 5 to about 20 sccm. A layer produced or deposited under these condition yields a silicon-rich, nitrogen-rich, and oxygen-lean top nitride layer 818, 1518.

Preferably, the top nitride layer 818, 1518 is deposited sequentially, after formation of the middle oxide layer, in the same process chamber used to form the bottom oxynitride layer 819, 1519, without altering the temperature to which the substrate 108 was heated during deposition of the bottom oxynitride layer 819, 1519. In one embodiment, the top nitride layer 818, 1518 is deposited sequentially following the deposition of the bottom oxynitride layer 819, 1519 by (1) moving to a different process chamber to form the middle oxide layer by radical oxidation of the bottom oxynitride layer, (2) returning to the process chamber used to form the bottom oxynitride layer and decreasing the flow rate of the N2O/NH3 gas mixture relative to the DCS/NH3 gas mixture to provide the desired ratio of the gas mixtures to yield the silicon-rich, nitrogen-rich, and oxygen-lean top nitride layer 818, 1518.

A suitable thickness for the bottom oxynitride layer 819, 1519 may be from about 30 Å to about 80 Å (with some variance permitted, for example +−10 Å), of which about 5-20 Å may be consumed by radical oxidation to form the middle oxide layer. A suitable thickness for the top nitride layer 818, 1518 may be at least 30 Å. In certain embodiments, the upper nitride layer may be formed up to 130 Å thick, of which 30-70 Å may be consumed by radical oxidation to form the top oxide layer. A ratio of thicknesses between the bottom oxynitride layer and the top nitride layer is approximately 1:1 in some embodiments, although other ratios are also possible.

The top oxide layer 120 includes a relatively thick layer of SiO2 of from about 30 Å to about 70 Å, and more preferably about 40-50 Å. The top oxide layer 120 may be formed or deposited by any suitable means including, for example, being thermally grown or deposited using CVD. In one embodiment, the top oxide layer 120 is a high-temperature-oxide (HTO) deposited using CVD process. This deposition process involves exposing the substrate 108 to a silicon source, such as silane, chlorosilane, or dichlorosilane, and an oxygen-containing gas, such as O2 or N2O in a deposition chamber at a pressure of from about 50 mT to about 1000 mT, for a period of from about 10 minutes to about 120 minutes while maintaining the substrate at a temperature of from about 650° C. to about 850° C.

The top oxide layer 120 may be formed by oxidizing the top nitride layer 818, 1518. This may be accomplished in the same chamber used to form the nitride layers 116, 818, 819. The nitride layers 818, 819, 1518, 1519 may be formed in a first chamber, and the oxide layers 116, 1521, 120 may formed in a second chamber, of a two-chamber tool. Suitable tools include, for example, an ONO AVP, commercially available from AVIZA technology of Scotts Valley, Calif.

Although shown and described above as having two nitride layers, i.e., a top and a bottom layer, the present invention is not so limited, and the multi-layer charge storing structure may include a number, n, of nitride layers, any or all of which may have differing stoichiometric compositions of oxygen, nitrogen and/or silicon. In particular, multi-layer charge storing structures having up to five, and possibly more, nitride layers each with differing stoichiometric compositions are contemplated. At least some of these layers will be separated from the others by one or more relatively thin oxide layers. However, as will be appreciated by those skilled in the art it is generally desirable to utilize as few layers as possible to accomplish a desired result, reducing the process steps necessary to produce the device, and thereby providing a simpler and more robust manufacturing process. Moreover, utilizing as few layers as possible also results in higher yields as it is simpler to control the stoichiometric composition and dimensions of the fewer layers.

It will further be appreciated that although applicable as part of a SONOS stack in a SONOS memory device, the structure and method of the present invention is not so limited, and the ONO structure can be used in or with any semiconductor technology or in any device requiring a charge storing or dielectric layer or stack including, for example, in a split gate flash memory, a TaNOS stack, in a 1T (transistor) SONOS cell, a 2T SONOS cell, a 3T SONOS cell, a localized 2-bit cell, and in a multilevel programming or cell, without departing from the scope of the invention.

Advantages of ONO structures and methods of forming the same according to an embodiment of the present invention over previous or conventional approaches include: (i) the ability to enhance data retention in memory devices using the structure by dividing the nitride layer into a plurality of films or layers and tailoring the oxygen, nitrogen and silicon profile across each layer, with an intermediate oxide layer to reduce the probability of charge tunneling; (ii) the ability to enhance speed of a memory device without compromising data retention; (iii) the ability to meet or exceed data retention and speed specifications for memory devices using an ONO structure of an embodiment of the present invention at a temperature of at least about 125° C.; and (iv) provide heavy duty program erase cycles of 100,000 cycles or more.

Implementations and Alternatives

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Embodiments of the charge retention devices described herein may be employed in logic circuits to function as machine-memory. Those having skill in the art will appreciate that there are various logic implementations that may embody the described structures, and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are many vehicles that may employ the devices described herein, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof.

Embodiments of the structures described herein may be employed in Application Specific Integrated Circuits (ASICs), Field Programmable Gate Arrays (FPGAs), central processing units (CPUs), digital signal processors (DSPs), or other integrated formats. However, those skilled in the art will recognize that some aspects of the embodiments disclosed herein, in whole or in part, can be equivalently implemented in dedicated memory circuits, for the purpose of storing digital information for data and/or programs running on one or more computers (e.g., as one or more programs running on one or more computer systems), as one or more programs running on one or more processors (e.g., as one or more programs running on one or more microprocessors), as firmware, or as virtually any combination thereof.

In a general sense, those skilled in the art will recognize that the various structures described herein may be embodied, individually and/or collectively, by a wide range of electrical circuitry. As used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system without an undue amount of experimentation.

What is claimed is:

1. A method of manufacturing a semiconductor device, comprising:
    forming a first oxide layer on a substrate;
    forming a nitride layer on the first oxide layer;
    forming a middle oxide layer inside the nitride layer;
    forming a second oxide layer on the nitride layer, wherein the second oxide layer includes high-temperature-oxide (HTO) deposited using chemical vapor deposition (CVD) process; and
    forming a control gate over the second oxide layer.

2. The method of manufacturing the semiconductor device of claim 1, wherein forming the HTO of the second oxide layer comprises:
    exposing the substrate to a silicon source at a pressure in an approximate range of 50 mT to 1000 mT and at a temperature in an approximate range of 650° C. to 850° C. for a time period in an approximate range of 10 minutes to 120 minutes.

3. The method of manufacturing the semiconductor device of claim 1, wherein the second oxide layer comprises a thickness in an approximate range of 30 Å to 70 Å.

4. The method of manufacturing the semiconductor device of claim 1, wherein forming the control gate comprises:
    forming a polysilicon layer using CVD process.

5. The method of manufacturing the semiconductor device of claim 1, wherein forming the first oxide layer comprises:
    performing wet oxidizing in a steam anneal.

* * * * *